US006323652B1

(12) United States Patent
Collier et al.

(10) Patent No.: US 6,323,652 B1
(45) Date of Patent: Nov. 27, 2001

(54) ELECTRICAL TESTING DEVICE

(76) Inventors: Stephen D. Collier; Wayne E. Hughes, both of Ground Check, Inc., P.O. Box 1555, Owensboro, KY (US) 42302

( * ) Notice: Subject to any disclaimer, the term of this patent is extended or adjusted under 35 U.S.C. 154(b) by 0 days.

(21) Appl. No.: 09/551,678

(22) Filed: Apr. 24, 2000

Related U.S. Application Data

(63) Continuation-in-part of application No. 08/953,402, filed on Oct. 17, 1997, now Pat. No. 6,054,849.

(51) Int. Cl.[7] .................................................. G01R 31/08
(52) U.S. Cl. ............................................ 324/508; 324/542
(58) Field of Search ..................................... 324/504, 508, 324/509, 542, 543

(56) References Cited

U.S. PATENT DOCUMENTS

| 3,723,863 | 3/1973 | Myers . |
|---|---|---|
| 4,859,932 | 8/1989 | Whitley . |
| 4,929,902 | 5/1990 | Nelson, III . |
| 5,192,912 | 3/1993 | Lemon . |
| 5,280,251 | 1/1994 | Strangio . |
| 5,285,163 | 2/1994 | Liotta . |
| 5,477,133 | 12/1995 | Earle . |
| 5,477,152 | 12/1995 | Hayhurst . |
| 5,572,117 | 11/1996 | Yoon . |
| 5,604,439 | 2/1997 | Walkington et al. . |
| 5,625,285 | 4/1997 | Virgilio . |
| 5,781,015 | 7/1998 | Duffin et al. . |

FOREIGN PATENT DOCUMENTS

| 245742 | 2/1961 | (AU) . |
|---|---|---|
| 2828095 | 1/1980 | (DE) . |
| 1587043 | 3/1981 | (GB) . |
| 06-3398 | 1/1994 | (JP) . |

*Primary Examiner*—Safet Metjahic
*Assistant Examiner*—Vincent Q Nguyen
(74) *Attorney, Agent, or Firm*—Richard C. Litman

(57) ABSTRACT

An electrical testing device for determining the continuity between ground terminals of an electrical power cord and determining the electrical grounding of an electrical power tool. The electrical testing device can also be configured to determine the proper polarity on each of the hot, negative, and ground cord wires of an electrical power extension cord. The electrical testing device includes a plastic case housing one or more batteries which supply power to a test button and the ground terminal of a female receptacle installed in the case. The top surface of the case includes a female receptacle, a test button, and a ground light. The top surface may also include a male plug and an additional female receptacle installed in the case. On the side of the case is an extending metal contact element. The test button is a single pole momentary contact test button. When this test button is actuated it closes the test button contacts thus completing a circuit which will illuminate the light if the light and the battery are good.

20 Claims, 8 Drawing Sheets

ELECTRICAL TESTING DEVICE

CROSS REFERENCE TO RELATED APPLICATION

This application is a continuation-in-part of application Ser. No. 08/953,402, filed Oct. 17, 1997, now U.S. Pat. No. 6,054,849.

BACKGROUND OF THE INVENTION

1. Field of the Invention

The present invention relates to an electrical testing device for electrical power extension cords and electrical power tools.

2. Description of Related Art

The maintenance of electrical power extension cords and electrical power tools in a proper and safe operating condition is a problem to which considerable attention need be given. In particular, electrically powered extension cords and tools used at construction or plant sites must be tested for proper wiring conditions daily so as to comply with governmental safety regulations as well as to insure their proper operating condition. In order to determine the proper and safe operating condition of a power tool or power extension cord, it is necessary to perform a number of individual tests. Due to the large number of cords and tools which may be utilized at a construction or plant site, it is necessary that the individual tests be performed as expediently as possible without sacrificing any quality and reliability in the testing procedure.

U.S. Pat. No. 4,859,932, issued on Aug. 22, 1989 to William E. Whitley, describes a multi-function tester. Whitley does not suggest the electrical testing device according to the claimed invention.

U.S. Pat. No. 5,280,251, issued on Jan. 18, 1994 to Christopher E. Strangio, describes a multi-conductor cable tester. Strangio does not suggest the electrical testing device according to the claimed invention.

U.S. Pat. No. 5,285,163, issued on Feb. 8, 1994 to William A. Liotta, describes a hand-held tester which performs both off-line continuity tests and on-line voltage tests for electrical cables and equipment. Liotta does not suggest the electrical testing device according to the claimed invention.

U.S. Pat. No. 5,477,133, issued on Dec. 19, 1995 to Kent L. Earle, describes an electrical test device for testing circuits. Earle does not suggest the electrical testing device according to the claimed invention.

U.S. Pat. No. 5,572,117, issued on Nov. 5, 1996 to Hee Y. Yoon, describes a multi-meter which is capable of measuring a Z-state of an output signal from a thing to be measured, in addition to high and low states thereof. Yoon does not suggest the electrical testing device according to the claimed invention.

U.S. Pat. No. 5,604,439, issued on Feb. 18, 1997 to Clifford L. Walkington et al., describes a tractor/trailer lamp circuit continuity test device. Walkington et al. do not suggest the electrical testing device according to the claimed invention.

U.S. Pat. No. 5,625,285, issued on Apr. 29, 1997 to Larry A. Virgilio, describes a self-contained, plug-in, hand-held device for testing the current carrying ability of the Hot wire and the Safety Ground return of standard AC outlets which have Hot, Neutral, and Ground connections. Virgilio does not suggest the electrical testing device according to the claimed invention.

Australia Patent document number 245,742, published on Feb. 9, 1961, describes a safety device for testing the earth lead and plug earth pin of an electrical appliance. Australia '742 does not suggest the electrical testing device according to the claimed invention.

The abstract and figure of Germany Patent document number 2,828,095, published on Jan. 10, 1980, describes a universal test plug with five contacts and five light emitting diodes (LEDs) on the bottom or front face that give a phase sequence indication. Germany '095 does not suggest the electrical testing device according to the claimed invention.

Great Britain Patent document number 1,587,043, published on Mar. 25, 1981, describes a portable testing device for determining earth leakage, earthing continuity, and open circuit load conditions on an electrical appliance terminated with a three-pin plug. Great Britain '043 does not suggest the electrical testing device according to the claimed invention.

U.S. Pat. No. 4,929,902, issued May 29, 1990, to Nelson, discloses a longline coaxial cable testing device having a transmitter-analyzer unit and a receiving unit. The device uses different size connectors to accommodate different size coaxial cables. The device requires a terminating receiver unit for shorting one end of the coaxial cable. Nelson does not provide a quantitative indication of the capability of the conductor to carry a required amount of current.

U.S. Pat. No. 5,192,912, issued Mar. 9, 1993, to Lemon, discloses a trailer wiring harness tester having a selectable AC/DC power source. Lemon does not provide a quantitative check of extension cords or power tool ground lines.

U.S. Pat. No. 3,723,863, issued Mar. 27, 1973, to Myers, discloses a portable ground continuity tester for checking the ground line of power tools. Myers does not provide a quantitative indication of the capability of the conductors in an extension cord to carry the required amount of current.

U.S. Pat. No. 5,477,152, issued Dec. 19, 1995, to Hayhurst, discloses a device for testing continuity and short circuits in cable. Hayhurst has a plurality of connectors (e.g., BNC, phono, F-type) in pairs electrically connected via the testing circuit for determining line breaks or shorts in a cable coupled between each pair of connectors. Hayhurst does not provide a quantitative indication of the capability of the conductor to carry a required amount of current.

U.S. Pat. No. 5,781,015, issued Jul. 14, 1998, to Duffin, et al., discloses an extension cord having an integral monitoring system for positively indicating the presence of power and current flow in the conductors of an extension cord. Duffin, et al. does not provide a quantitative indication of the capability of the conductor to carry a required amount of current.

Japanese Patent Document No. 06-3398, published Jan. 11, 1994, discloses a multiconductor cable break tester having a pair of cable connectors for coupling a cable under test to the device, and a plurality of LEDs for indicating the continuity of the conductors in the cable. The continuity is determined by moving the cable, placing the connectors under a physical load, and observing the LEDs for indications of a conductor break or discontinuity. Japanese Patent Document No. 06-3398 does not provide a quantitative indication of the capability of the conductor to carry required amount of current.

None of the above inventions and patents, taken either singly or in combination, is seen to describe the instant invention as claimed.

SUMMARY OF THE INVENTION

The present invention is one of several embodiments of an electrical testing device for determining the continuity between ground terminals of an electrical power extension cord and for determining the electrical grounding of an electrical power tool. The electrical testing device can also be configured to determine the proper polarity on each of the hot, negative, and ground cord wires of an electrical power extension cord. Each embodiment generally comprises a plastic case housing one or more batteries which supplies power to a test button and the ground terminal of a female receptacle installed in the case. The one or more batteries are preferably 9 volt batteries.

The top surface of the case includes a female receptacle, a test button, and a ground light. The top surface may also include a male plug and an additional female receptacle installed in the case. On the side of the case is an extending metal contact point. The test button is a single pole momentary contact test button. When this test button is actuated it closes the test button contacts thus completing a circuit which will illuminate the light if the light and the battery are good.

Accordingly, it is a principal object of the invention to provide an electrical testing device for effectively testing the ground continuity between ends of an electrical power cord and for testing the electrical grounding of an electrical power tool.

It is another object of the invention is to provide an electrical testing device which is simple, small and portable.

It is a further object of the invention to provide an electrical testing device for testing the continuity and polarity of the hot, negative, and ground terminals of the female and male ends of an electrical power extension cord.

It is an object of the invention to provide improved elements and arrangements thereof in an electrical testing device for the purposes described which is inexpensive, dependable and fully effective in accomplishing its intended purposes.

These and other objects of the present invention will become readily apparent upon further review of the following specification and drawings.

BRIEF DESCRIPTION OF THE DRAWINGS

Similar reference characters denote corresponding features consistently throughout the attached drawings.

DETAILED DESCRIPTION OF THE PREFERRED EMBODIMENTS

The present invention is an electrical testing device for determining the continuity between ground terminals of an electrical power extension cord and determining the electrical grounding of an electrical power tool. The present invention also provides for an arrangement for insuring that electrical power extension cords have proper polarity on each of the hot, negative, and ground cord wires. Due to safety regulations, electrical power tools and equipment are periodically tested for proper operating conditions to prevent accidents/electrical shock. This normally involves going out into construction sites and carrying out tests on the electrical power tools and equipment at routine intervals of time.

Electrical power extension cords as well as electrical power tools such as drills, saws, and the like normally operate from a standard 120V outlet which includes a three-socket female receptacle having contacts which are supplied electrical power by incoming hot, neutral, and ground conductors. The electrically powered tools must have their metal frames grounded for safety and this ground is normally provided by a wire connection from the frame to a ground wire in the electrical circuit of the tool which mates through the plug of the tool to the ground conductor of the electrical outlet receptacle. In the event a short should occur between one of the power carrying conductors of the tool and the frame of the tool, the tool is automatically grounded. In order that the grounding be effected any electrical power extension cord through which the tool is operated must be of proper wiring polarity.

Figure 1:
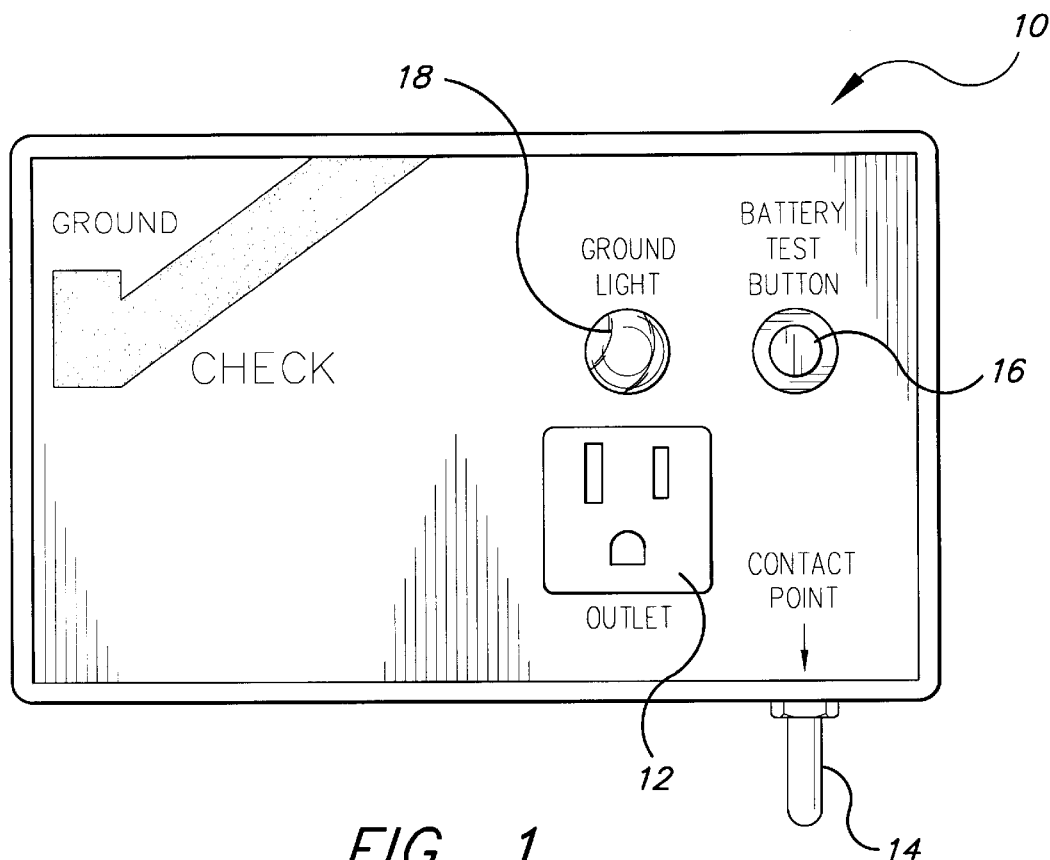
FIG. 1 is a top view of a first embodiment of an electrical testing device according to the invention.

Referring now to the drawings, FIG. 1 illustrates a first embodiment of an electrical testing device designated generally at 10. The electrical testing device 10 generally comprises a plastic case housing a battery which supplies power both to a test button 16 and the ground portion of a female receptacle installed in the case. The battery is preferably a 9 volt battery. The case for the testing device 10 preferably measures 5¾ inch×3½ inch×1¼ inch. Obviously, the size of the case may vary to meet manufacturing needs.

Figure 2:
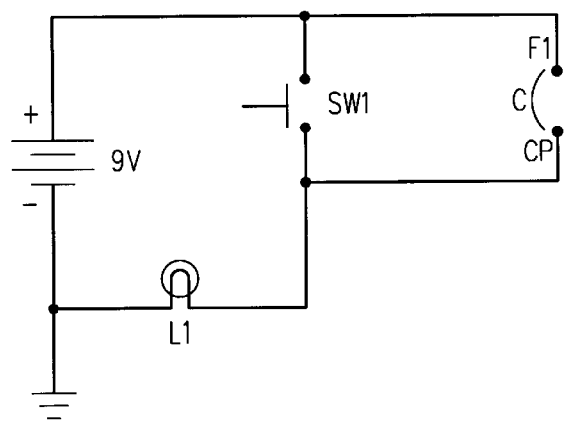
FIG. 2 is an electrical circuit diagram of the first embodiment of the invention.

The top surface of the case includes a female receptacle 12, a test button 16, and a ground light 18. On the side of the case is a contact point 14 in the form of a projecting metal element. The test button 16 is a single pole momentary contact pushbutton. When this test button 16 is actuated it closes the switch (SW1) contacts thus completing a circuit which will illuminate the light 18 if the light and the battery are good. As shown in FIG. 2, the positive battery terminal is connected to the test button 16 (SW1) and the ground terminal of the female receptacle 12 (F1). The ground light 18 (L1) is connected between the negative battery terminal, the test button 16 (SW1) and the contact point 14 (CP). When the test button 16 is depressed the ground light 18 illuminates if there is a sufficiently powered battery installed in the case.

To test the ground continuity of an electrical power extension cord, the male cord end of the cord is inserted into the female receptacle 12 on the testing device 10. The ground terminal of the female cord end of the cord is brought into contact with the contact point 14. If continuity exists between the ground terminal on the male end of the cord with the ground terminal on the female end of the cord, the ground light 18 will illuminate. If the light does not illuminate a discontinuity exists between the ground terminal on the male end of the cord and the ground terminal on the female end of the cord.

To test the electrical grounding of an electrically powered tool (not shown), the male plug of the tool power cord is inserted into the female receptacle 12 on the testing device 10. The metal case of the power tool is brought into contact with the contact point 14. If the power tool is electrically grounded a connection will exist between the ground terminal on the male end of the tool power cord and the contact point 14, and the ground light 18 will illuminate. If the light 18 does not illuminate the power tool is not properly grounded.

Figure 3:
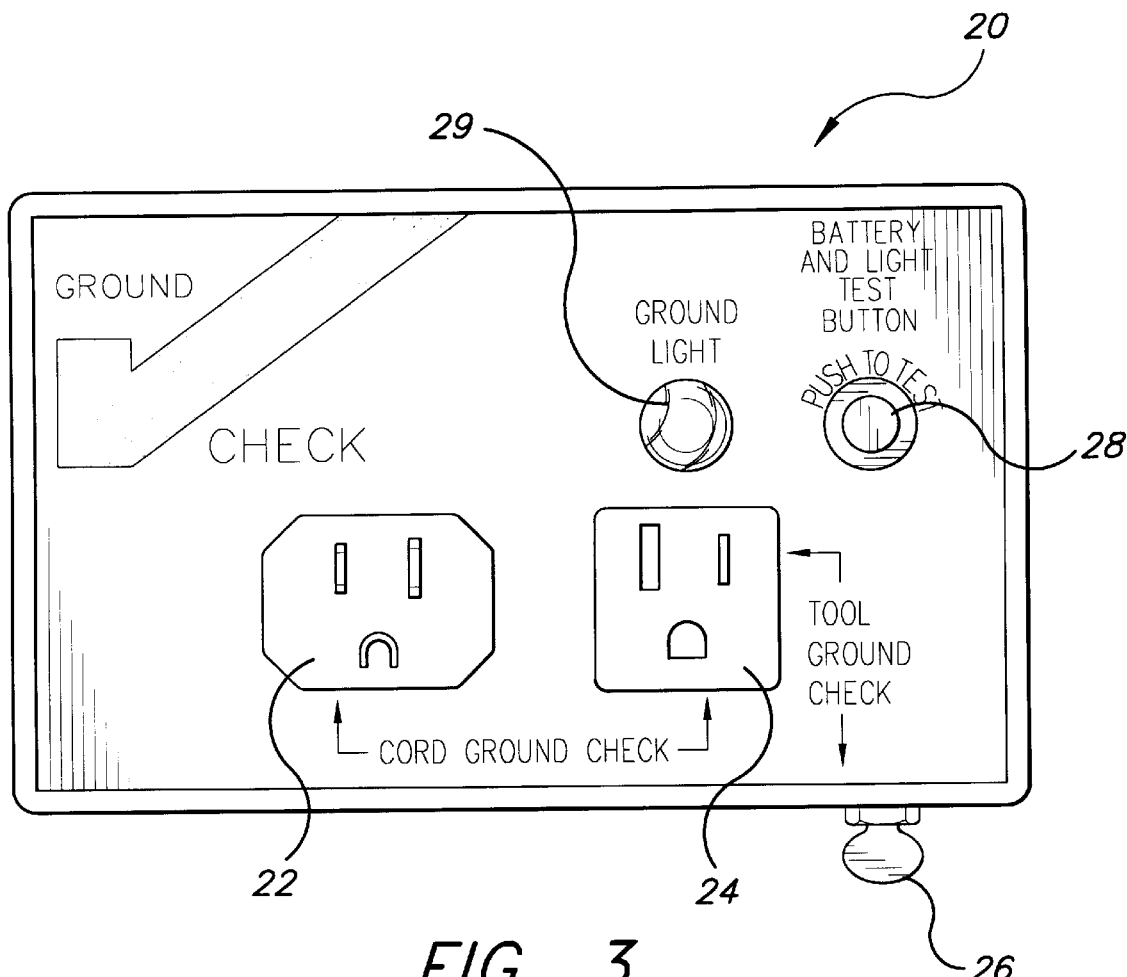
FIG. 3 is a top view of a second embodiment of an electrical testing device according to the invention.

FIG. 3 illustrates a second embodiment of an electrical testing device designated generally at 20. The electrical testing device 20 comprises a plastic case housing a battery which supplies power both to a test button 28 and the ground terminals of a male plug 22 and a female receptacle 24 installed in the case. The battery is preferably a 9 volt battery. The case for the testing device 20 preferably measures 5¾ inch×3½ inch×1¼ inch. Obviously, the size of the case may vary to meet manufacturing needs.

Figure 4:
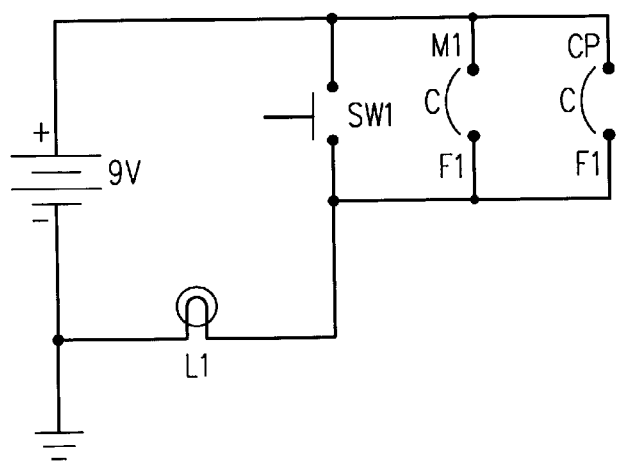
FIG. 4 is an electrical circuit diagram of the second embodiment of the invention.

The top surface of the case includes the male plug 22, the female receptacle 24, a test button 28, and a ground light 29. On the side of the case is a contact point 26 in the form of a projecting metal element. As shown in FIG. 4, the positive battery terminal is connected to the test button 28 (SW1), the ground terminal of the male receptacle 22 (M1), and the contact point 26 (CP). The ground light 28 (L1) is connected between the negative battery terminal, the test button 28 (SW1), and the ground terminals of the female receptacle 24. The test button 28 is a single pole momentary contact pushbutton. When this test button 28 is actuated it closes the switch (SW1) contacts thus completing a circuit which will illuminate the light 28 if the light and the battery are good.

To test the ground continuity of an electrical power extension cord, the female cord end of the cord is inserted onto the male plug 22 and the male cord end of the cord is inserted into the female receptacle 24 on the testing device 20. If continuity exists between the ground terminal on the female end of the power cord with the ground terminal on the male end of the power cord, the ground light 28 will illuminate. If the light 28 does not illuminate a discontinuity exists between the ground terminal on the female end of the power cord and the ground terminal on the male end of the power cord.

To test the electrical grounding of an electrically powered tool (not shown), the male plug of a tool power cord is inserted into the female receptacle 24 on the testing device 20. The metal case of the power tool is brought into contact with the contact point 26. If the power tool is electrically grounded a connection will exist between the ground terminal on the male end of the tool power cord and the contact point 26, and the ground light 28 will illuminate. If the light 28 does not illuminate the power tool is not properly grounded.

Figure 5:
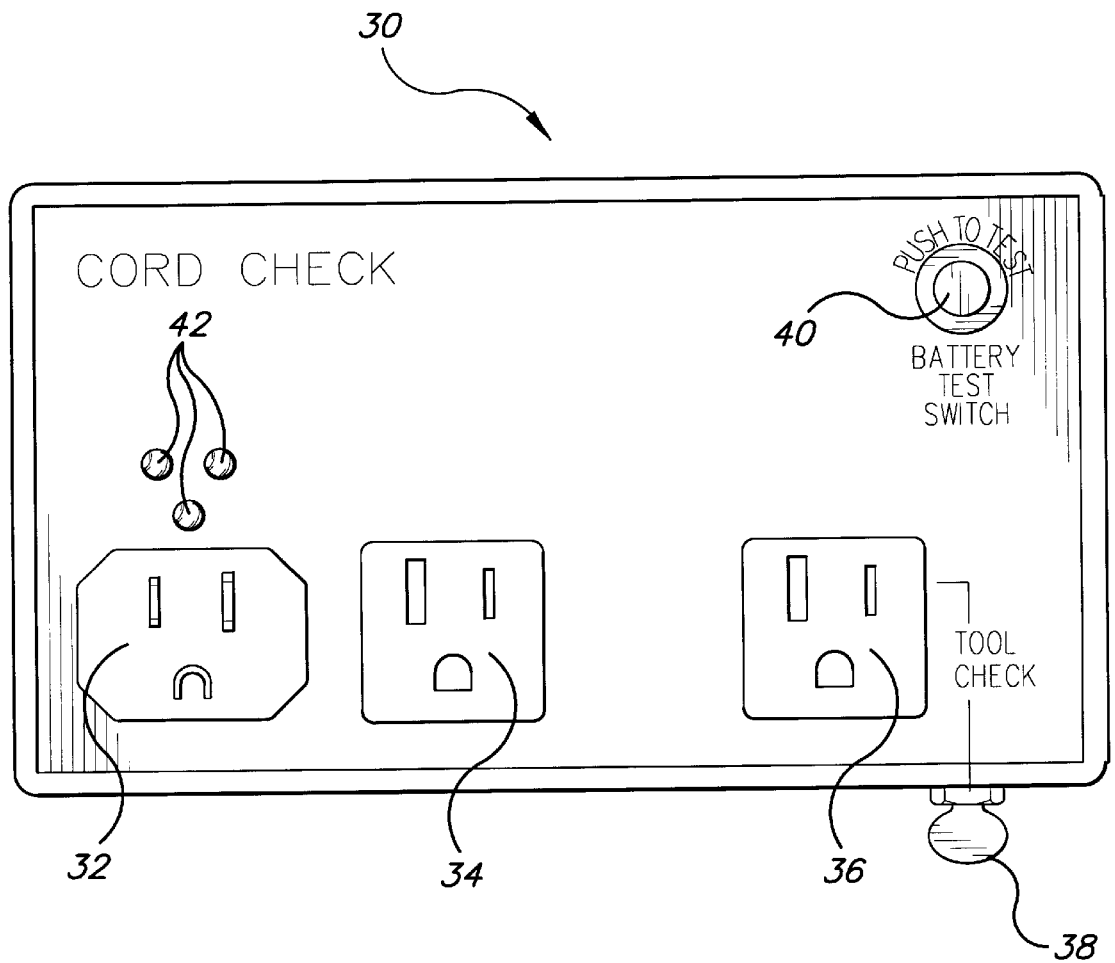
FIG. 5 is a top view of a third embodiment of an electrical testing device according to the invention.

FIG. 5 illustrates a third embodiment of an electrical testing device designated generally at 30. The electrical testing device 30 comprises a plastic case housing three batteries which supply power to a test button 40, the ground terminal of a second female receptacle 36 installed on the testing device 30, and the hot, negative, and ground terminals of a male plug 32 and a first female receptacle 34 installed in the plastic case. The batteries are preferably 9 volt batteries.

Figure 6:
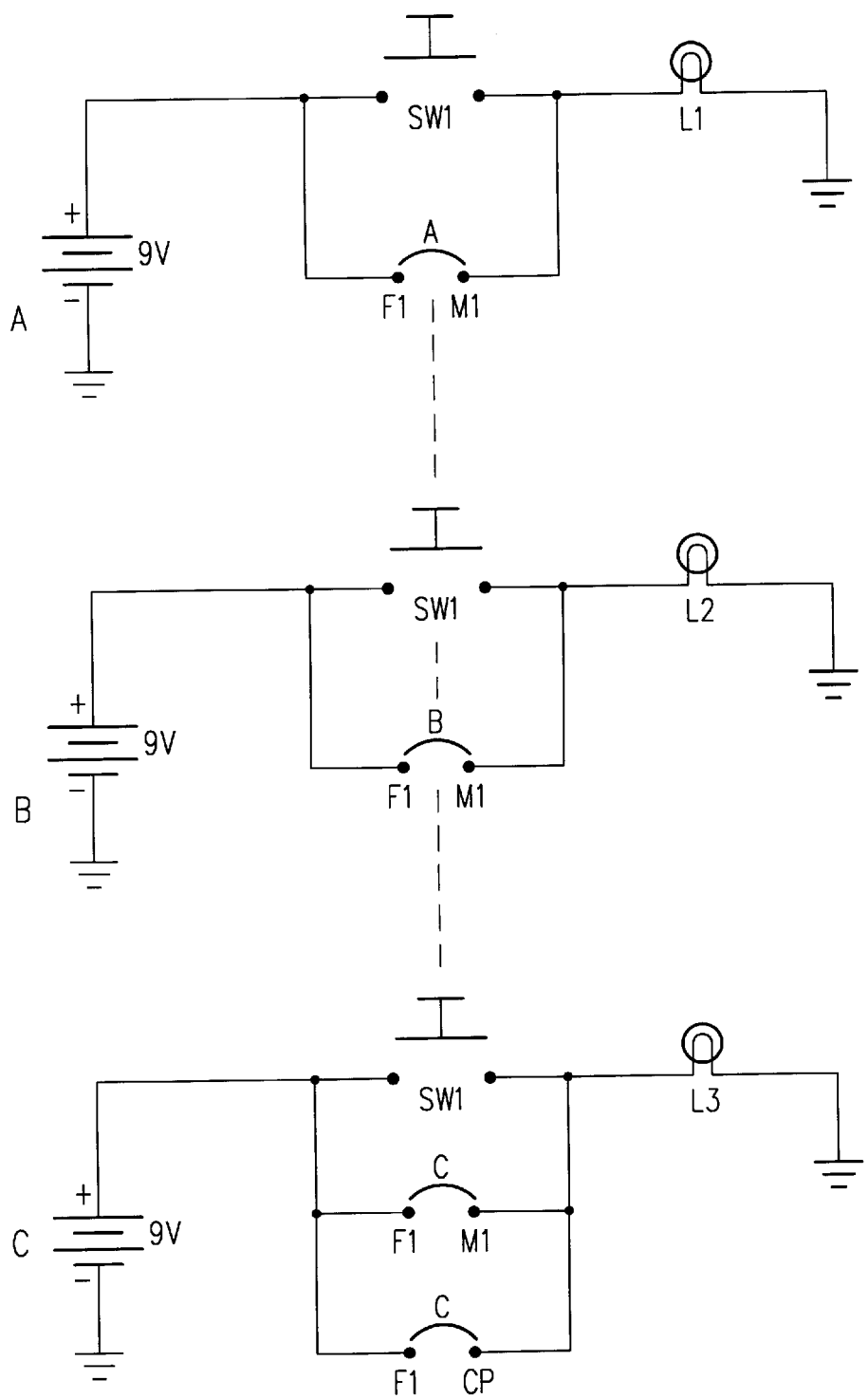
FIG. 6 is an electrical circuit diagram of the third embodiment of the invention.

The top surface of the case includes the male plug 32, the first female receptacle 34, the second female receptacle 36, a test button 40, and green and blue indicator lights 42. On the side of the case is a contact point 38 in the form of a projecting metal element. As shown in FIG. 6, the positive battery terminal is connected to the test button 40 (SW1). The test button 40 is a single pole momentary contact pushbutton. When this test button 40 is actuated it closes the switch (SW1) contacts thus completing a circuit which will illuminate the indicator lights 42 if the light and the battery are good.

To test the continuity and polarity of the hot, negative, and ground terminals (A,B,C) in an electrical power extension cord, the female cord end of the cord is inserted onto the male plug 32 and the male cord end of the cord is inserted into the female receptacle 34 of the testing device 30. If continuity and proper polarity exists between the hot, negative, and ground terminals (A,B,C) of the female and male ends of the cord, the green and blue indicator lights 42 (L1, L2, L3) will illuminate. If continuity and proper polarity does not exist between any of the terminals of the cord, one or more of the green and blue indicator lights 42 (L1, L2, L3) will not illuminate.

To test the electrical grounding of an electrically powered tool (not shown), the male plug of a tool power cord is inserted into the female receptacle 36 on the testing device 30. The metal case of the power tool is brought into contact with the contact point 38. If the power tool is electrically grounded a connection will exist between the ground terminal on the male plug of the tool power tool cord and the contact point 38, and the lower light of the three indicator lights 42 will illuminate. If the light does not illuminate the power tool is not properly grounded.

Figure 7:
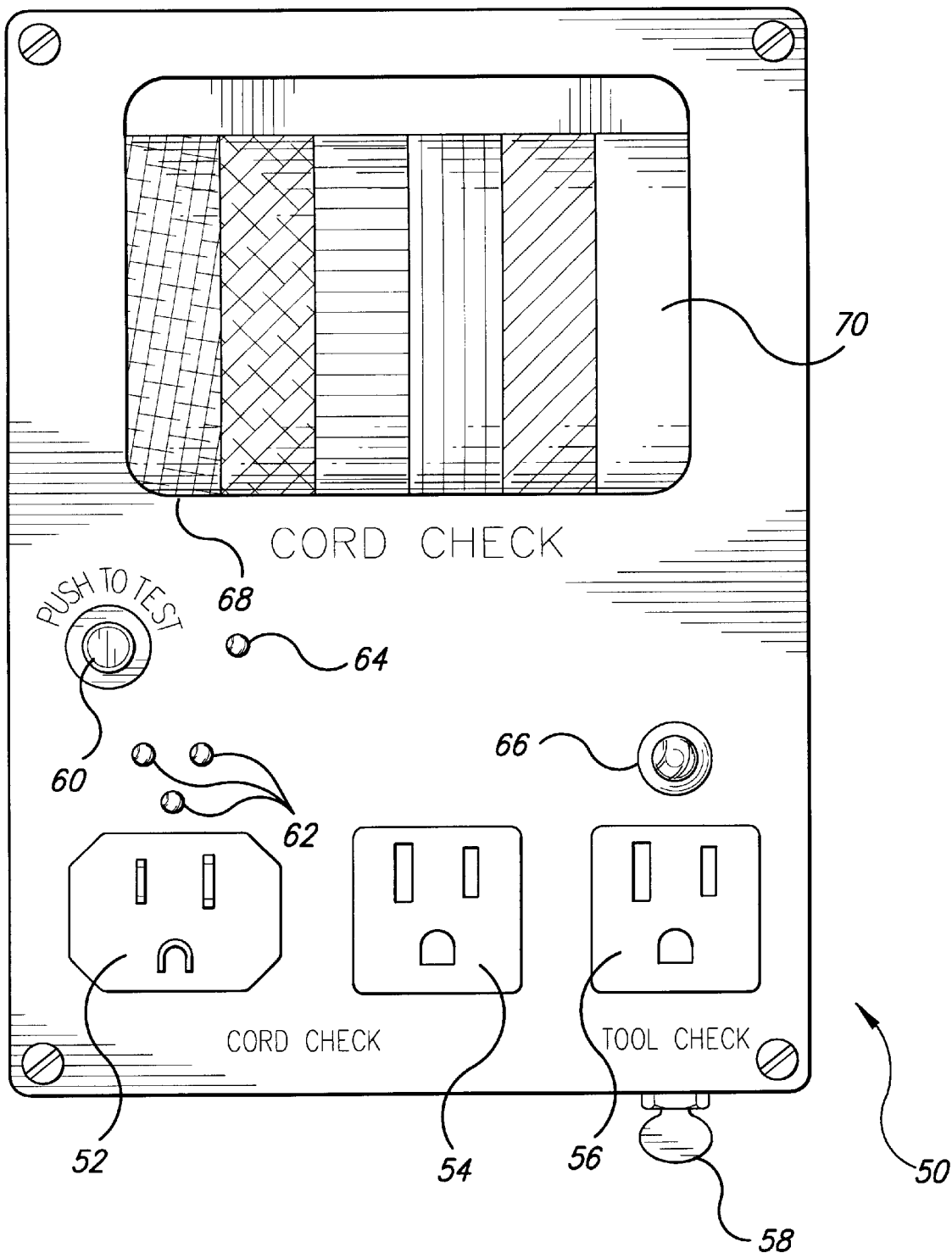
FIG. 7 is a top view of a fourth embodiment of an electrical testing device according to the invention.

FIG. 7 illustrates a fourth embodiment of an electrical testing device designated generally at 50. The electrical testing device 50 comprises a plastic case housing a battery which supplies power to a test button 60, the ground terminal of a second female receptacle 56 installed on the testing device 50, and an internal circuit which interconnects the hot, negative, and ground terminals of a male plug 52 and a first female receptacle 54 installed on the testing device 50. The battery is preferably a 9 volt battery.

Figure 8:
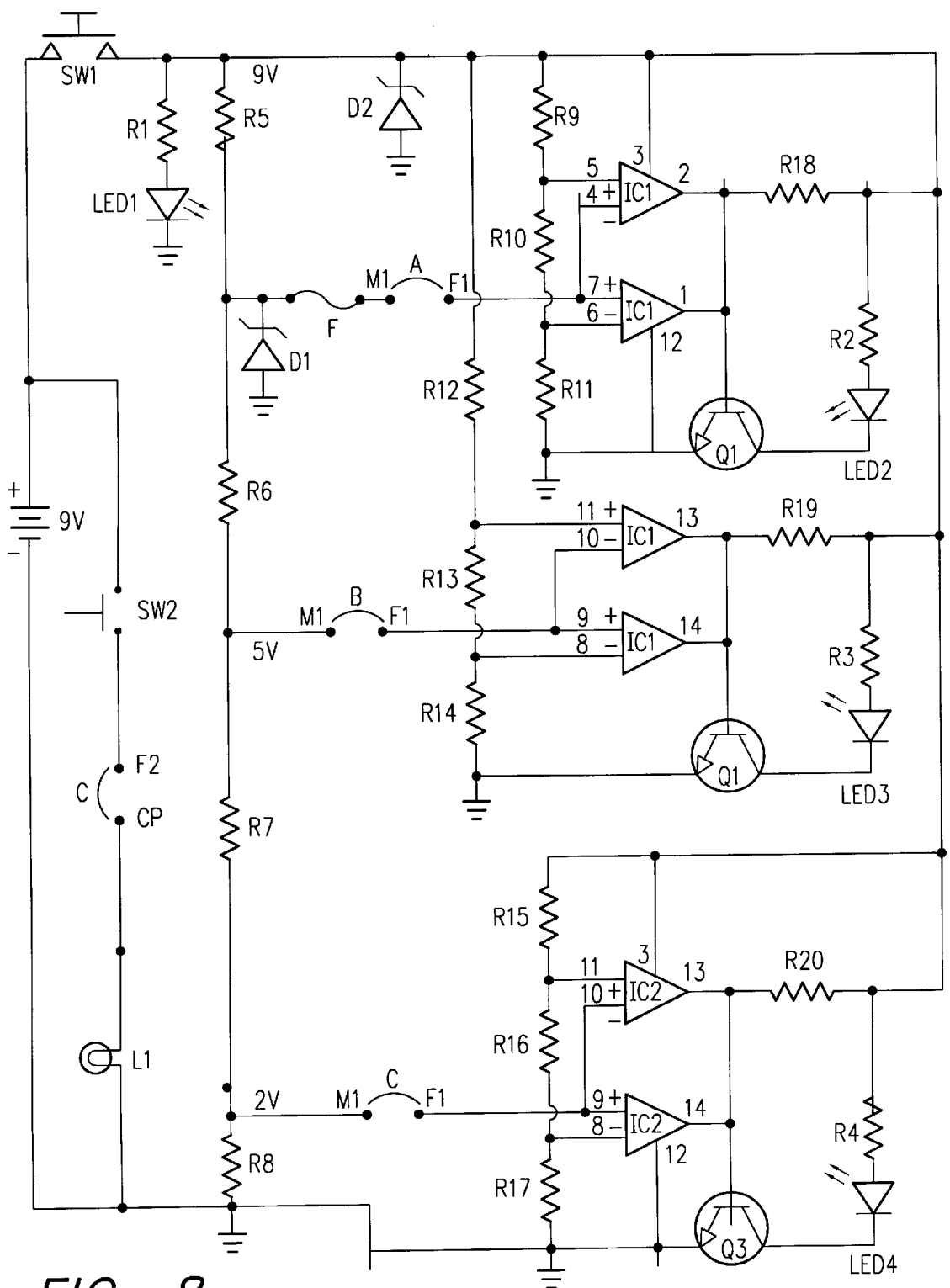
FIG. 8 is an electrical circuit diagram of the fourth embodiment of the invention.

The top surface of the case includes the male plug 52, the first female receptacle 54, the second female receptacle 56, a test button 60, green LED indicator lights 62, a red LED indicator light 64, a red ground light 66, and a tape receptacle 68 for holding color coded tape 70. On the side of the case is a contact point 58 in the form of a projecting metal element. As shown in FIG. 8, the positive battery terminal is connected to the test button 60 (SW1). The test button 60 is a single pole momentary contact pushbutton. When this test button 60 is actuated it closes the switch (SW1) contacts thus completing a circuit which will illuminate the red LED light 64 (LED1) if the light and the battery are good. As shown in FIG. 8, the internal circuit interconnects the hot, negative, and ground terminals (A,B,C) of the installed male plug 52 and the hot, negative, and ground terminals (A,B,C) of the installed female receptacle 54.

To test the continuity and polarity of the hot, negative, and ground terminals (A,B,C) in an electrical power extension cord, the female cord end of the cord is inserted onto the male plug 52 and the male cord end of the cord is inserted into the female receptacle 54 of the testing device 50. If continuity and proper polarity exists between the hot, negative, and ground terminals (A,B,C) of the female and male ends of the cord, the green LED indicator lights 62 (LED2, LED3, LED4) will illuminate. If continuity and polarity do not exist between any of the terminals of the cord, one or more of the green LED indicator lights 62 will not illuminate.

To test the electrical grounding of an electrically powered tool (not shown), the male plug of the tool power cord is inserted into the female receptacle 56 on the testing device 50. The metal case of the power tool is brought into contact with the contact point 58. If the power tool is electrically grounded a connection will exist between the ground terminal on the male end of the tool power cord and the contact point 58, and the red ground light 66 will illuminate. If the red light 66 does not illuminate the power tool is not properly grounded.

In the illustrated fourth embodiment of the electrical testing device 50 the circuit elements are preferably, but not limited to:

| Component | Part Number or rating |
|---|---|
| R1 | 1 kΩ |
| R2 | 1 kΩ |
| R3 | 1 kΩ |
| R4 | 1 kΩ |
| R5 | 2.4 kΩ |
| R6 | 2.6 kΩ |
| R7 | 3.9 kΩ |
| R8 | 3 kΩ |
| R9 | 2.2 kΩ |
| R10 | 1.8 kΩ |
| R11 | 13 kΩ |

| Component | Part Number or rating |
|---|---|
| R12 | 6.6 kΩ |
| R13 | 1.8 kΩ |
| R14 | 10 kΩ |
| R15 | 6.8 kΩ |
| R16 | 1.8 kΩ |
| R17 | 10 kΩ |
| R18 | 10 kΩ |
| R19 | 10 kΩ |
| R20 | 10 kΩ |
| IC1 | LM 339 |
| IC2 | MPS 2222A |
| LED1-4 | GREEN 2.8V |
| SW1 | SPST PUSH |
| D1 | 7V 5W ZENER |
| D2 | 9V 1W ZENER |

Figure 9:
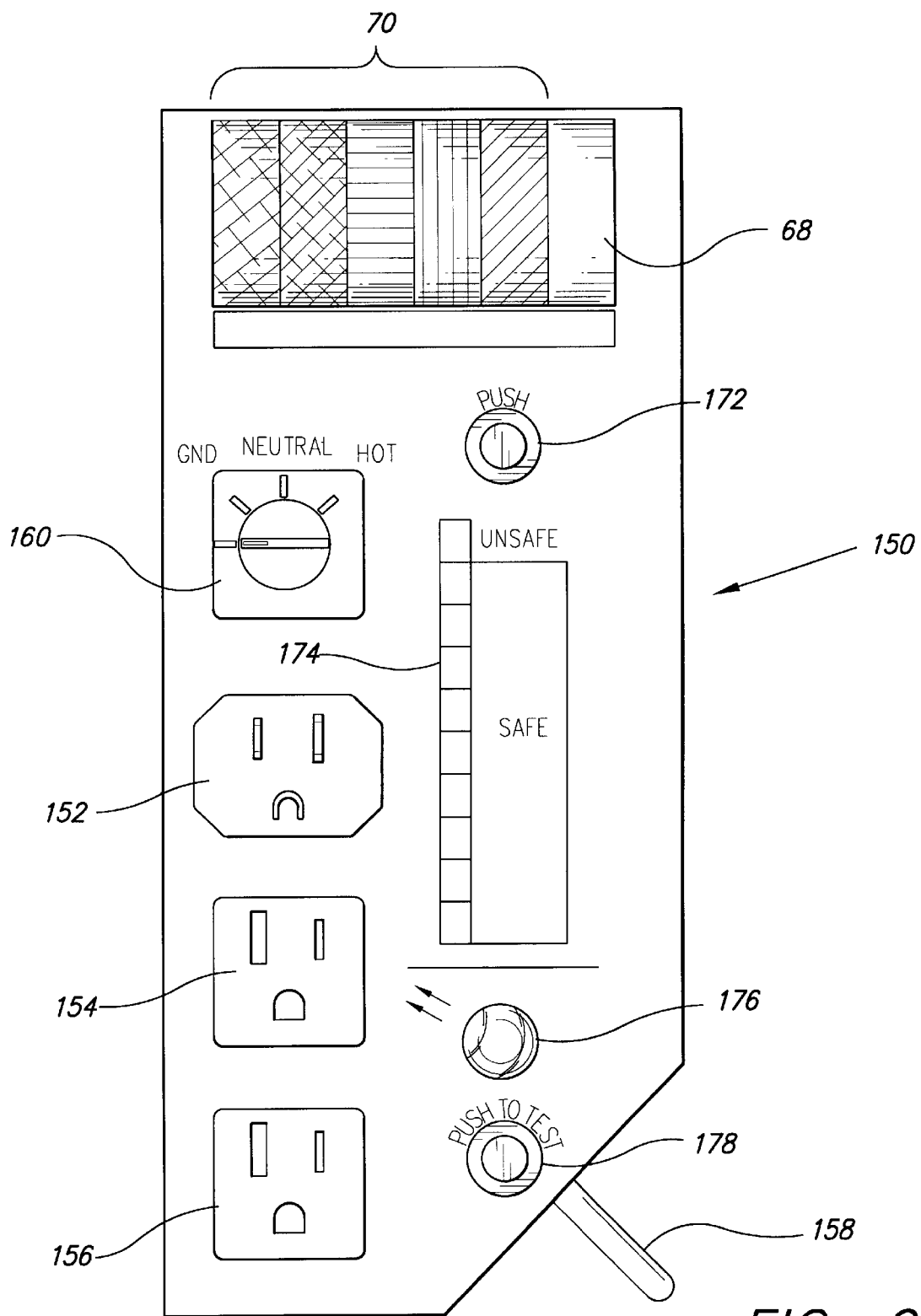
FIG. 9 is a top view of a preferred fifth embodiment of an electrical testing device according to the invention.
Figure 10:
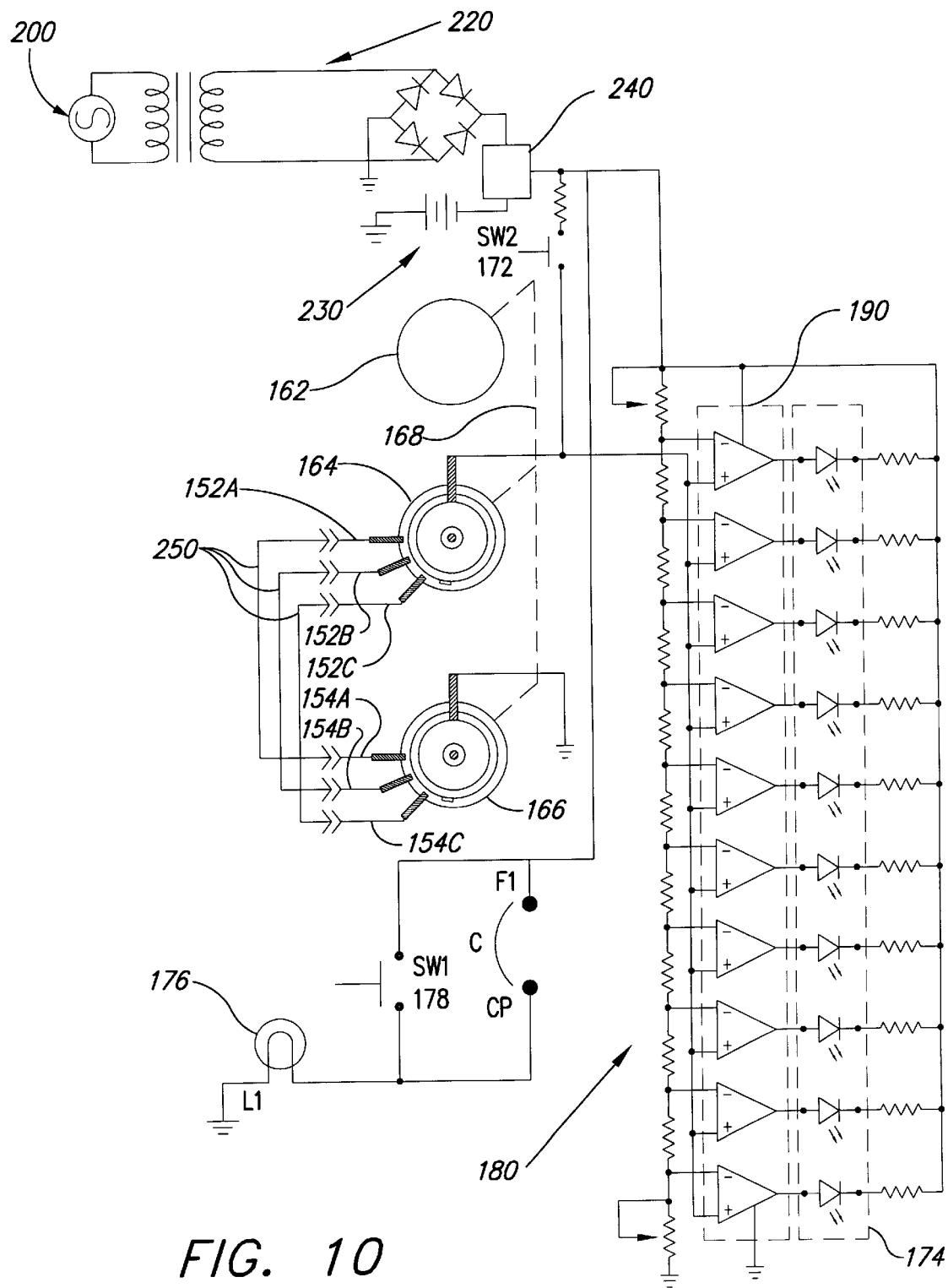
FIG. 10 is an electrical circuit diagram of the preferred fifth embodiment of the invention.

Referring now to FIGS. 9 and 10, the fifth and preferred embodiment is illustrated as an electrical testing device, similar to the embodiments discussed above. The electrical testing device has a case 150 for housing the circuitry (see FIG. 10) used checking the proper ground continuity of power tools and extension cord conductor continuity. The case 150 includes a receptacle 68 for holding a plurality of color coded tape rolls 70.

A male plug 152 extends from the case 150. A first female plug receptacle 154 having recesses for receiving a male plug of a unit under test, is cooperatively disposed adjacent to the male plug 152. The male plug 152 and the first female receptacle 154 electrically cooperate to execute the testing of an extension cord for conductor continuity. A selector switch 160 provides a sequential selection of which conductor of the extension cord test is being tested. The selector switch 160 has generally three positions with indicia marking the ground (GND), neutral, and hot conductor selections. A first test button 172 initiates the extension cord conductor test. A peak meter 174 formed of a serial array of light emitting diodes (LEDs) indicates whether a conductor under test is within a safe range of operating. The case includes indicia outlining the LEDs as being safe and has an upper unsafe boundary.

A second female receptacle 156 having recesses for receiving a male plug of a unit under test, and a metal contact point 158 extending from a side of the case 150 electrically cooperate to test the ground continuity of a power tool. A second test switch 178, and a lamp 176 provide an indication that the voltage level of the power supply is adequate.

Referring now to FIG. 10, the circuit of the testing device is shown. The circuit is generally housed internally in the case 150. The circuit has several components that are in electrical and physical communication with the exterior of the case 150. The circuit receives power from a power supply having a supply selector 240. The supply selector 240 outputs the necessary voltage and current for the testing device to operate. The supply selector 240 may be a switching mechanism (mechanical or automatic), a multiplexing electrical changeover mechanism, or a bypass type device. The specific arrangement for the supply selector 240 is not necessary for the proper operation of the testing device.

The supply selector 240 receives at least two electrical power inputs. Conventionally known and widely used power sources are useable in the testing device. In this preferred embodiment, a power transformer and bridge circuit 220 for receiving AC electrical power 200 and converting the received power into DC electrical power of the required voltage is provided. Also in this preferred embodiment, a battery pack 230 may be used to supply DC electrical power. Power transformer 220 is of conventional design and well known in the art for providing DC electrical power. Likewise, any conventional battery (e.g., solar collector, dry cell, wet cell, alkaline, nickel-cadmium, lithium, etc.) is useable as battery pack 230 and is well known in the art for providing DC electrical power. Further, it is also well known that one or more batteries would be defined as battery pack 230. These two alternative sources of electrical power have been shown as inputs to the supply selector 240, however, it is well within the scope of this disclosure to use any other source of electrical power as well.

The ground line continuity test is accomplished via the second female receptacle 156 and the metal contact probe 158, schematically illustrated as F1 and CP in FIG. 10, across which a conductor under test C is placed. If the conductor C provides a proper ground line, then the lamp L1,176 will illuminate. A test of the power supplied via power selector 240 and lamp L1 is provided by the switch 178 by completing a conductive path from the power selector 240 to the lamp 176. If either lamp 176 is defective or insufficient power is outputted from supply selector 240, lamp 176 will be extinguished and corrective measures should be undertaken.

In order to validate the continuity and the electrical load carrying capacity of each conductor 250 of an extension cord, or the like, the remaining portions of the circuit of FIG. 10 is utilized. The male plug 152 has electrical contacts 152A,152B,152C coupling the ground, neutral and hot conductors 250 of the extension cord under test. Likewise, the first female receptacle 154 has electrical contacts 154A, 154B,154C coupling the respective ground neutral and hot conductors 250 of the extension cord under test. These contacts are sequentially linked by the selector switch 160 (FIG. 9), via an armature 162 that correspondingly actuates a double pole, triple throw switch. The double pole, triple throw switch is schematically represented as first pole 164 and second pole 166. The second pole 166 couples the conductor 250 under test to ground, while the first pole 164 couples the conductor 250 under test to the power supplied via supply selector 240.

The circuit of FIG. 10 further includes peak comparative circuitry for determining the continuity and electrical load carrying capability of each conductor 250. The comparative circuitry includes an impedance bridge 180 the provides a standard voltage drop step along the length of the bridge 180. Between each resistor of the bridge 180, a nodal tap exists in order to read a reference voltage at that step and each node has the same reference current value. This is a conventional reference voltage step scheme. A plurality of comparators are provided generally in the form of a packaged integrated circuit (IC) 190. Each comparator of IC 190 is coupled to a respective node of the impedance bridge 180 so that each comparator receives a reference voltage that is one step differential from the succeeding comparator reference voltage. Also, each comparator receives a voltage and current component received from the conductor 250 under test. Each comparator then compares the voltage and current components from the conductor 250 under test to the reference voltage step and reference current value from the impedance bridge 180. The output of each comparator corresponds to a predetermined impedance value. The output of IC 190 feeds into an array of light emitting diode (LED) elements, where each LED receives a signal from each comparator of IC 190.

The outputs of each comparator of IC 190 reflect a range of impedance values typically from>2 Ω to<0.2 Ω, having a uniform step value therebetween. The array of LEDs 174 will each illuminate if the output of the respective comparator from IC 190 has the appropriate step values at the input thereof. As seen in FIG. 9, the array of LEDs are bounded by an upper unsafe region. If there is continuity in a conductor 250 under test and the impedance is cut of the safe range for carrying an electrical load, then the upper most LED (nominally colored red) would illuminate, indicating that the conductor 250 is unsafe for use. If there is continuity in a conductor 250 under test and the impedance is within the safe range for carrying an electrical load, then one or more of the LEDs (nominally colored green) would illuminate, indicating that the conductor 250 is safe for use. The number of green colored LEDs of the array 174 is a peak value measurement of the impedance of the conductor 250 under test, providing a quantitative assessment of the conductor. The test is commenced by a momentary actuation of first switch 172 on the case 150 (SW2 in the circuit).

In use, electrical equipment (such as power tools, extension cords, etc.) are periodically checked to verify electrical integrity. The readily available color coded tape rolls 70 provide the end user with an acceptable marking mechanism to both validate and void an item for use. For example, if a power drill is tested quarterly, then the four rolls of tape 70 would be provided in the receptacle 68, each having a unique color. Upon testing the ground continuity of the drill, a user would plug the drill into female receptacle 156, the user will mark the cord with one of the color tapes 70 from the tape receptacle 68 corresponding to the current quarter to validate that the drill has proper ground continuity. On the other hand, the user would use the same color tape, wrapped around the plug tines in order to void the use of the drill until it has been corrected or disposed of. Likewise, to test an extension cord the user would plug the male plug 152 into the female end of the cord, and the male end of the cord into the first female receptacle 154 of the case 150. The selector switch 160 is turned to sequentially select the ground, neutral and hot conductors. Upon actuation of first switch 172, the appropriate number of LEDs in array 174 will illuminate.

It is to be understood that the present invention is not limited to the embodiments described above, but encompasses any and all embodiments within the scope of the following claims.

We claim:

1. An electrical testing device comprising: a case, a tape receptacle integrally formed in said case for holding a plurality of rolls of color coded tape, a power source, a first female receptacle disposed in said case for receiving a three-prong plug of an electrical power cord under test, a metal contact element extending from said case, indicating means on said case for indicating proper ground line continuity, and testing means coupled to said power source and said indicating means for testing said power source and said indicating means; said electrical testing device determining the continuity between ground terminals of said electrical power cord and determining the electrical grounding of an electrical power tool under test, said testing device further comprising:

a male plug extending from said case, said male plug having a hot contact, a neutral contact, and a ground contact;

a second female receptacle having respectively a hot contact, a neutral contact, and a ground contact recessed into said case;

circuit means electrically coupled to said male plug and said second female receptacle for determining whether an impedance amount of the respective hot, neutral, and ground contact of said electrical power cord under test is in a safe operating range;

a sequential switch for selectively coupling each respective said hot contact, said neutral contact and said ground contact to said circuit means;

an actuation means for selectively providing electrical power from said power source to said circuit means; and display means for quantitatively indicating the impedance.

2. The electrical testing device according to claim 1, said sequential switch includes a double pole triple throw switch.

3. The electrical testing device according to claim 1, said actuation means includes a switch for connecting said power supply to said circuit means.

4. The electrical testing device according to claim 1, wherein said case is plastic.

5. The electrical testing device according to claim 4, wherein said power source is chosen from the group consisting of a DC battery and an AC to DC transforming adapter.

6. The electrical testing device according to claim 5, wherein said display means includes a serial array of light emitting diodes.

7. The electrical testing device according to claim 6, wherein said serial array of light emitting diodes form a peak measurement bar for indicating the impedance, whereby said peak measurement bar includes a safe range bounded by an upper unsafe range.

8. The electrical testing device according to claim 1, wherein said circuit means includes comparator means for comparing voltages and currents across the conductor to reference voltages and currents.

9. The electrical testing device according to claim 8, said comparator means includes an IC chip having a plurality of comparators, and said display means being responsive to each one of said plurality of comparators.

10. The electrical testing device according to claim 9, said display means includes a serial array of light emitting diodes forming a peak measurement bar, wherein said peak measurement bar includes a safe range bounded by an upper unsafe range.

11. An electrical testing device for determining the continuity between ground terminals of an electrical power cord and determining the electrical grounding of an electrical power tool comprising:

a case having tape receptacle;

a plurality of color coded tape rolls disposed in said tape receptacle;

a power source;

a male plug connector extending from said case;

a first female receptacle recessed in said case;

a first circuit disposed in said case and electrically coupled between said male plug and said first female receptacle for determining whether an impedance amount of an extension cord under test having a male plug at one end and a female receptacle at the other end which respectively including hot, neutral and ground contacts is in a safe operating range;

a sequential switch for selectively coupling each respective said hot contact, said neutral contact and said ground contact to said circuit means;

a first test button for selectively providing electrical power from said power source to said circuit means;

a first indicator on said case for quantitatively indicating the impedance;

whereby the determination of said extension cord under test being capable of conducting a required electrical load occurs upon inserting said male plug into said first female receptacle and receiving said male plug connector into a female socket of the extension cord under test and actuating said first test button;

a second female receptacle disposed in said case for receiving a three-prong plug;

a test button for testing said power source;

a second indicator on said case for indicating proper ground continuity; and a metal contact probe extending from said case;

whereby the determination of proper grounding occurs upon inserting said male plug of said electrical power cord or of said electrical power tool into said second female receptacle and contacting said metal contact probe with said ground contact of the electrical power cord or with a conductive portion of the electrical power tool.

12. The electrical testing device according to claim 11, said sequential switch includes a double pole triple throw switch.

13. The electrical testing device according to claim 11, said actuation means includes a switch for connecting said power supply to said circuit means.

14. The electrical testing device according to claim 11, wherein said case is plastic.

15. The electrical testing device according to claim 14, wherein said power source is chosen from the group consisting of a DC battery and an AC to DC transforming adapter.

16. The electrical testing device according to claim 15, wherein said first indicator includes a serial array of light emitting diodes.

17. The electrical testing device according to claim 16, wherein said serial array of light emitting diodes form a peak measurement bar for indicating the impedance, whereby said peak measurement bar includes a safe range bounded by an upper unsafe range.

18. The electrical testing device according to claim 11, wherein said circuit means includes comparator means for comparing voltages and currents across the conductor to reference voltages and currents.

19. The electrical testing device according to claim 18, said comparator means includes an IC chip having a plurality of comparators, and said display means being responsive to each one of said plurality of comparators.

20. The electrical testing device according to claim 19, said display means includes a serial array of light emitting diodes forming a peak measurement bar, wherein said peak measurement bar includes a safe range bounded by an upper unsafe range.

* * * * *